(12) United States Patent
Van Schoot et al.

(10) Patent No.: US 10,289,006 B2
(45) Date of Patent: May 14, 2019

(54) BEAM DELIVERY FOR EUV LITHOGRAPHY

(71) Applicant: ASML Netherlands B.V., Veldhoven (NL)

(72) Inventors: Jan Bernard Plechelmus Van Schoot, Eindhoven (NL); Markus Franciscus Antonius Eurlings, Tilburg (NL); Hermanus Johannes Maria Kreuwel, Schijndel (NL)

(73) Assignee: ASML Netherlands B.V., Veldhoven (NL)

( * ) Notice: Subject to any disclaimer, the term of this patent is extended or adjusted under 35 U.S.C. 154(b) by 138 days.

(21) Appl. No.: 14/648,452

(22) PCT Filed: Nov. 26, 2013

(86) PCT No.: PCT/EP2013/074710
§ 371 (c)(1),
(2) Date: May 29, 2015

(87) PCT Pub. No.: WO2014/095261
PCT Pub. Date: Jun. 26, 2014

(65) Prior Publication Data
US 2015/0334813 A1 Nov. 19, 2015

Related U.S. Application Data

(60) Provisional application No. 61/740,439, filed on Dec. 20, 2012.

(51) Int. Cl.
*G03B 27/54* (2006.01)
*G03F 7/20* (2006.01)
(Continued)

(52) U.S. Cl.
CPC ..... *G03F 7/70033* (2013.01); *G02B 19/0023* (2013.01); *G02B 19/0047* (2013.01);
(Continued)

(58) Field of Classification Search
CPC ........... G02B 19/0023; G02B 19/0047; G02B 27/0983; G03F 7/7008; G03F 7/70025;
(Continued)

(56) References Cited

U.S. PATENT DOCUMENTS 5,144,476 A 9/1992 Kebo
2002/0044629 A1* 4/2002 Hertz ................. G03F 7/70033
378/119
(Continued)

FOREIGN PATENT DOCUMENTS

JP S61-193890 A 8/1986
JP H08-95107 A 4/1996
(Continued)

OTHER PUBLICATIONS

International Search Report directed to related International Patent Application No. PCT/EP2013/074710, dated Feb. 19, 2014; 4 pages.
(Continued)

*Primary Examiner* — Christina A Riddle
(74) *Attorney, Agent, or Firm* — Sterne, Kessler, Goldstein & Fox P.L.L.C.

(57) ABSTRACT

A beam delivery apparatus is used with a laser produced plasma source. The beam delivery apparatus comprises variable zoom optics (550) operable to condition a beam of radiation so as to output a conditioned beam having a configurable beam diameter (b) and a plurality of mirrors (530a, 530b) operable to direct the conditioned beam of radiation to a plasma generation site. The beam delivery apparatus enables control of the axial position of the beam
(Continued)

where the beam has a particular diameter, with respect to the beam's focus position (570). Also, a method is used to control the axial position of the location at a plasma generation site where a beam has a particular diameter, with respect to the beam's focus position.

19 Claims, 3 Drawing Sheets

(51) Int. Cl.
*H05G 2/00* (2006.01)
*G02B 19/00* (2006.01)
*G02B 27/09* (2006.01)

(52) U.S. Cl.
CPC ......... *G02B 27/0983* (2013.01); *G03F 7/702* (2013.01); *G03F 7/70025* (2013.01); *G03F 7/70041* (2013.01); *G03F 7/70183* (2013.01); *H05G 2/006* (2013.01); *H05G 2/008* (2013.01)

(58) Field of Classification Search
CPC ............. G03F 7/70033; G03F 7/70041; G03F 7/70183; G03F 7/70166; G03F 7/702; G03F 7/70008; H05G 2/006; H05G 2/008
USPC ......... 355/52, 53, 55, 67–71, 77; 250/492.1, 250/492.2, 492.22, 492.23, 492.3, 493.1, 250/503.1, 504 R, 548; 378/34; 313/231.31, 231.61; 315/111.21
See application file for complete search history.

(56) References Cited

U.S. PATENT DOCUMENTS

| 2005/0178979 | A1* | 8/2005 | Masaki | G03F 7/70916 250/492.1 |
|---|---|---|---|---|
| 2005/0274897 | A1 | 12/2005 | Singer et al. | |
| 2006/0219957 | A1 | 10/2006 | Ershov et al. | |
| 2010/0078577 | A1* | 4/2010 | Moriya | H05G 2/005 250/504 R |
| 2010/0117009 | A1 | 5/2010 | Moriya et al. | |
| 2010/0127191 | A1 | 5/2010 | Partlo et al. | |
| 2010/0258748 | A1 | 10/2010 | Vaschenko et al. | |
| 2011/0013166 | A1 | 1/2011 | Loopstra et al. | |
| 2011/0317256 | A1 | 12/2011 | Hou et al. | |
| 2012/0243566 | A1* | 9/2012 | Hori | H01S 3/10061 372/27 |
| 2013/0015319 | A1 | 1/2013 | Moriya et al. | |
| 2013/0037693 | A1 | 2/2013 | Moriya et al. | |
| 2013/0048886 | A1 | 2/2013 | Moriya et al. | |
| 2013/0141709 | A1 | 6/2013 | Loopstra et al. | |

FOREIGN PATENT DOCUMENTS

| JP | H08-267264 A | 10/1996 | | |
|---|---|---|---|---|
| JP | 2008-532232 A | 8/2008 | | |
| JP | 2010-135769 A | 6/2010 | | |
| JP | WO 2011102277 A1 * | 8/2011 | ............... | H05G 2/00 |
| JP | WO 2011122689 A1 * | 10/2011 | ............ | H05G 2/003 |
| JP | 2012-134447 A | 7/2012 | | |
| JP | 2012-160565 A | 8/2012 | | |
| JP | 2012-169241 A | 9/2012 | | |
| JP | 2012-178534 A | 9/2012 | | |
| JP | 2012-523694 A | 10/2012 | | |
| JP | 2013-529848 A | 7/2013 | | |
| JP | 2013-543210 A | 11/2013 | | |
| WO | WO 2011/122397 A1 | 10/2011 | | |
| WO | WO 2011/162903 A1 | 12/2011 | | |
| WO | WO 2012/031841 A1 | 3/2012 | | |
| WO | WO 2012/104670 A1 | 8/2012 | | |

OTHER PUBLICATIONS

International Preliminary Report on Patentability and Written Opinion of the International Searching Authority directed to related International Patent Application No. PCT/EP2013/074710, dated Jun. 23, 2015; 7 pages.

English-language machine translation of Japanese Patent Publication No. JP 2008-532232 A, published Aug. 14, 2008; 21 pages.

* cited by examiner

BEAM DELIVERY FOR EUV LITHOGRAPHY

CROSS-REFERENCE TO RELATED APPLICATIONS

This application claims the benefit of U.S. provisional application 61/740,439, which was filed on 20 Dec. 2012, and which is incorporated herein in its entirety by reference.

FIELD OF THE INVENTION

The present invention relates to a lithographic apparatus and in particular a beam delivery apparatus for delivering a laser beam to a fuel source is a laser produced plasma (LPP) source of an EUV lithographic apparatus.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

In current LPP sources it can be difficult to control the laser beam in an axial direction such that the fuel is hit by the laser in an efficient manner

SUMMARY

It is desirable to simplify control of the laser beam in an axial direction.

The invention in a first aspect provides a beam delivery apparatus for a laser produced plasma source comprising: variable zoom optics being operable to condition a beam of radiation so as to output a conditioned beam having a configurable beam diameter; and a plurality of mirrors operable to direct the conditioned beam of radiation to a plasma generation site.

An embodiment of the present invention in a further aspect provides for a method of controlling the axial position of the location at a plasma generation site where a beam has a particular diameter, with respect to the beam's focus position, the beam of radiation having a non-uniform diameter along its optical axis, the method comprising: passing the beam through variable zoom optics to obtain a conditioned beam; directing the conditioned beam to the plasma generation site; and using the variable zoom optics to control of the axial position at which the beam has a particular diameter, with respect to the beam's focus position.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 1:
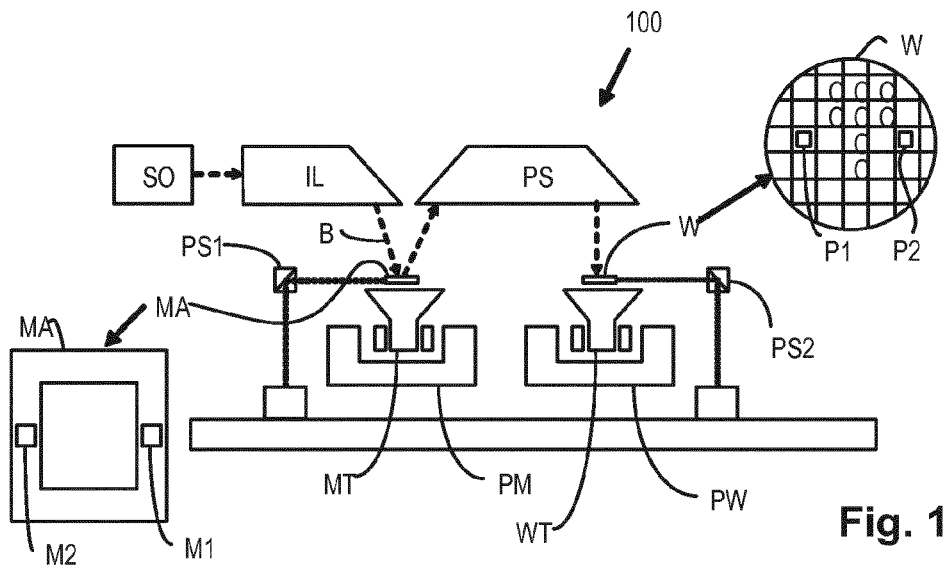
FIG. 1 depicts schematically a lithographic apparatus having reflective projection optics.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
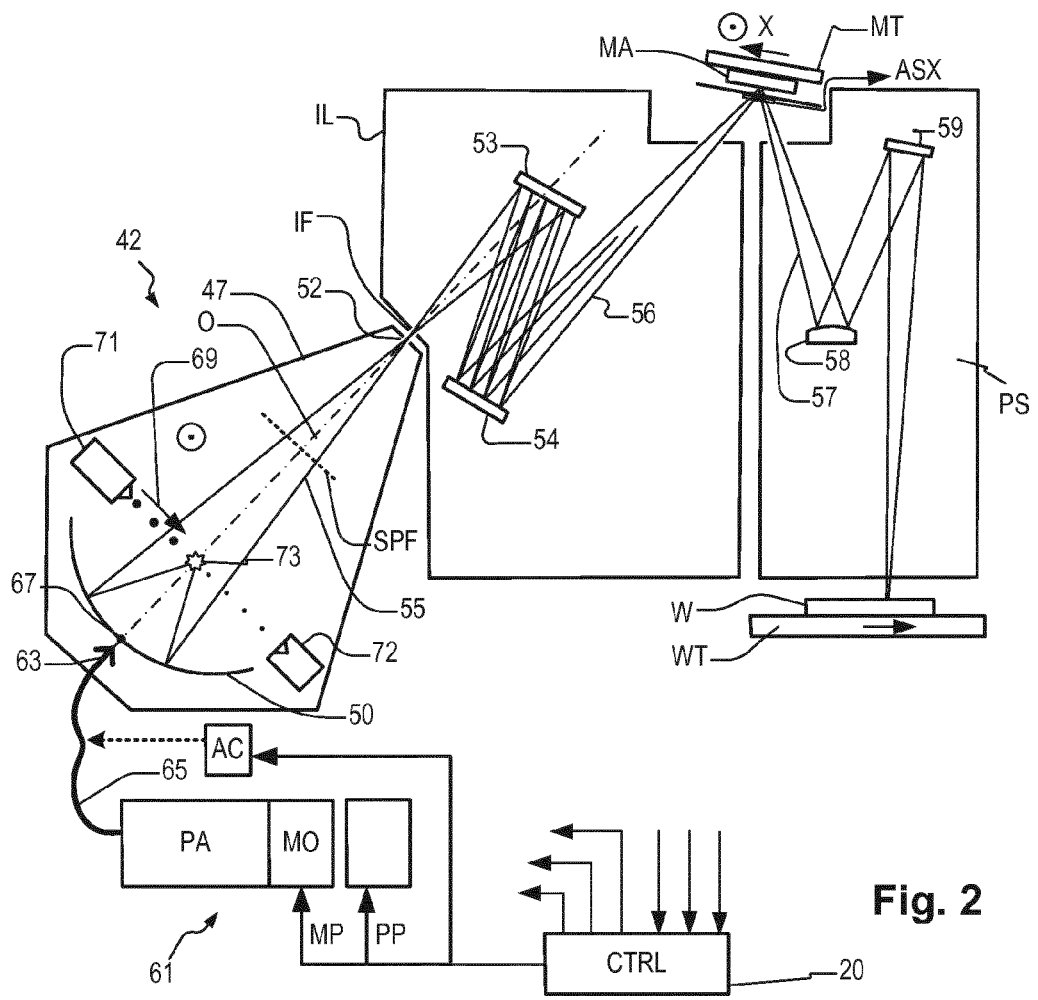
FIG. 2 is a more detailed view of the apparatus of FIG. 1.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, optical excitation using $CO_2$ laser light. Partial pressures of, for example, 10 Pa of Xe, Li, Sn vapor or any other suitable gas or vapor may be required for efficient generation of the radiation. In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also collector mirror 50 which, in the example of FIG. 2, is a normal-incidence collector, for instance a multi-layer mirror.

As part of an LPP radiation source, a laser system 61 (described in more detail below) is constructed and arranged to provide a laser beam 63 which is delivered by a beam delivering system 65 through an aperture 67 provided in the collector mirror 50. Also, the radiation system includes a target material 69, such as Sn or Xe, which is supplied by target material supply 71. The beam delivering system 65, in this embodiment, is arranged to establish a beam path focused substantially upon a predetermined plasma position 73.

In operation, the target material 69, which may also be referred to as fuel, is supplied by the target material supply 71 in the form of droplets. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. As mentioned, the fuel may be for example xenon (Xe), tin (Sn) or lithium (Li). These create a highly ionized plasma with electron temperatures of several 10's of eV. Higher energy EUV radiation may be generated with other fuel materials, for example Tb and Gd. The energetic radiation generated during de-excitation and recombination of these ions includes the wanted EUV radiation which is emitted from the plasma at position 73. The plasma formation position 73 and the aperture 52 are located at first and second focal points of collector 50, respectively and the EUV radiation is focused by the normal-incidence collector 50 onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56 onto a patterning device (e.g., reticle or mask) positioned on a support (e.g., reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present than the two elements 58 and 59 shown in FIG. 2. Radiation collectors similar to radiation collector 50 are known from the prior art.

Figure 3:
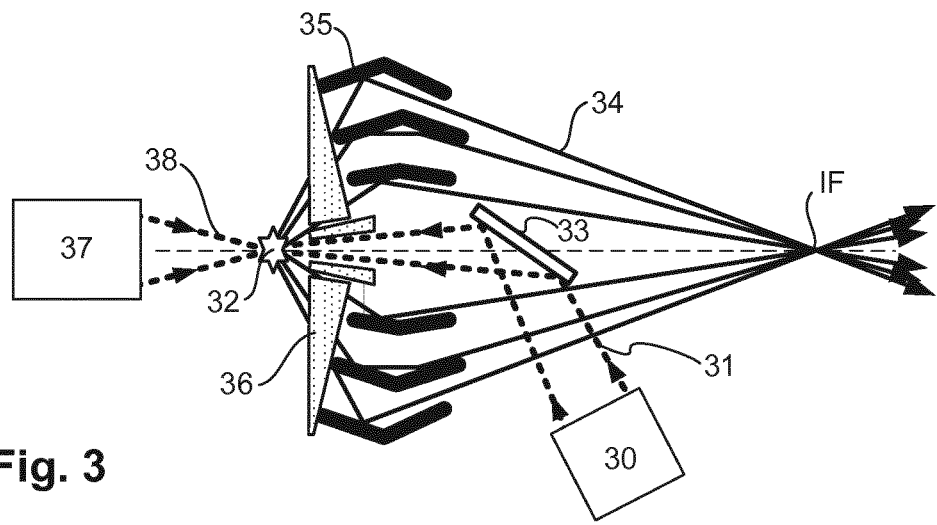
FIG. 3 shows an alternative configuration for the LPP radiation source in the apparatus of FIGS. 1 and 2.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source collector module 42, the X axis coincides broadly with the direction of fuel stream (69, described below), while the Y axis is orthogonal to that, pointing out of the page as indicated in FIG. 3. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma produces other wavelengths of radiation, for example in the visible, UV and DUV range. There is also IR radiation present from the laser beam 63. The non-EUV wavelengths are not wanted in the illumination system IL and projection system PS and various measures may be deployed to block the non-EUV radiation. As schematically depicted in FIG. 2, a transmissive SPF may be applied upstream of virtual source point IF. Alternatively or in addition to such a filter, filtering functions can be integrated into other optics. For example a diffractive filter can be integrated in collector 50 and/or mirrors 53, 54 etc., by provision of a grating structure tuned to divert the longer, IR radiation away from the virtual source point IF. Filters for IR, DUV and other unwanted wavelengths may thus be provided at one or more locations along the paths of beams 55, 56, 57, within source module (radiation system 42), the illumination system IL and/or projection system PS.

FIG. 3 shows an alternative LPP source arrangement which may be used in place of that illustrated in FIG. 2. A main difference is that the main pulse laser beam is directed onto the fuel droplet from the direction of the intermediate focus point IF, such that the collected EUV radiation is that which is emitted generally in the direction from which the main laser pulse was received. FIG. 3 shows the main laser 30 emitting a main pulse beam 31 delivered to a plasma generation site 32 via at least one optical element (such as a lens or folding mirror) 33. The EUV radiation 34 is collected by a grazing incidence collector 35 such as those used in discharge produced plasma (DPP) sources. Also shown is a debris trap 36, which may comprise one or more stationary foil traps and/or a rotating foil trap, and a pre pulse laser 37 operable to emit a pre pulse laser beam 38.

To deliver the fuel, which for example is liquid tin, a droplet generator or target material supply 71 is arranged within the source chamber 47, to fire a stream of droplets towards the plasma formation position 73. In operation, laser beam 63 may be delivered in a synchronism with the operation of target material supply 71, to deliver impulses of radiation to turn each fuel droplet into a plasma. The frequency of delivery of droplets may be several kilohertz, or even several tens or hundreds of kilohertz. In practice, laser beam 63 may be delivered by a laser system 61 in at least two pulses: a pre pulse PP with limited energy is delivered to the droplet before it reaches the plasma location, in order to vaporize the fuel material into a small cloud (or deforms it into a flattened "pancake" shape), and then a main pulse MP of laser energy is delivered to the cloud at the desired location, to generate the plasma. In a typical example, the diameter of the plasma is about 0.2-0.5 mm. A trap 72 is provided on the opposite side of the enclosing structure 47, to capture fuel that is not, for whatever reason, turned into plasma.

Referring to laser system 61 in more detail, the laser in the illustrated example is of the MOPA (Master Oscillator Power Amplifier) type. The laser system 61 includes a "master" laser or "seed" laser, labeled MO in the diagram, followed by a power amplifier system PA, for firing a main pulse of laser energy towards an expanded droplet cloud, and a pre pulse laser for firing a pre pulse of laser energy towards a droplet. A beam delivery system 24 is provided to deliver the laser energy 63 into the source chamber 47. In practice, the pre-pulse element of the laser energy may be delivered by a separate laser. Laser system 61, target material supply 71 and other components can be controlled by a control module 20. Control module 20 may perform many control functions, and have many sensor inputs and control outputs for various elements of the system. Sensors may be located in and around the elements of radiation system 42, and optionally elsewhere in the lithographic apparatus. In one embodiment of the present invention, the main pulse and the pre pulse are derived from a same laser. In another embodiment of the present invention, the main pulse and the pre-pulse are derived from different lasers which are independent from each other.

Many measures can be applied in the controller 20. Such measures include monitoring to check that the virtual source point IF is aligned with the aperture 52, at the exit from the source chamber 47. In systems based on LPP sources, control of alignment is generally achieved by controlling the location of the plasma formation position 73, rather than by moving the collector optic 50. The collector optic, the exit aperture 52 and the illuminator IL are aligned accurately during a set-up process, so that aperture 52 is located at the second focal point of collector optic. However, the exact location of the virtual source point IF formed by the EUV radiation at the exit of the source optics is dependent on the exact location of the plasma, relative to the first focal point of the collector optic. To fix this location accurately enough to maintain sufficient alignment generally requires active monitoring and control.

For this purpose, controller 20 in this example may control the location of the plasma 73 (the source of the EUV radiation), by controlling the injection of the fuel, and also for example the timing of energizing pulses from laser. In a typical example, energizing pulses of laser radiation 63 are delivered at a rate of 50 kHz (period 20 µs), and in bursts lasting anything from, say, 20 ms to 20 seconds. The duration of each main laser pulse may be around 0.1 to 0.2 μs, as may the resulting EUV radiation pulse. By appropriate control, it can be maintained that the EUV radiation beam is focused by collector optic 50 precisely on the aperture 52. If this is not achieved, all or part of the beam will impinge upon surrounding material of the enclosing structure. In that case, a heat dissipation mechanism can be used to absorb the EUV radiation incident on the enclosing structure.

In accordance with current practice, control module 20 is supplied with monitoring data from one or more arrays of sensors (not shown) which provide a first feedback path for information as to the location of the plasma. The sensors may be of various types, for example as described in US20050274897A1, which is incorporated by reference herein in its entirety, mentioned in the introduction. The sensors may be located at more than one position along the radiation beam path. They may for example be located around and/or behind the field mirror device 53, purely for the sake of example. The sensor signals just described can be used for control of the optical systems of the illuminator IL and projection system PS. They can also be used, via feedback path, to assist the control module 20 of the radiation system 42 to adjust the intensity and position of the EUV plasma source 73. The sensor signals can be processed for example to determine the observed location of the virtual source IF, and this is extrapolated to determine, indirectly, the location of the EUV source. If the virtual source location drifts, as indicated by the sensor signals, corrections can be applied by control module 20 to re-center the beam in the aperture 52. Also, the beam delivery system 65 can include a mirror. A main pulse laser fired by laser system 61 may be incident on the mirror and directed by the mirror towards a droplet. Sensors can be placed close to such a mirror for monitoring a tilting angle of the mirror, and the relevant monitoring data relating to the tilting angle are fed back to control module 20. Control module 20 can use the relevant monitoring data from the sensors to trigger the actuator AC to adjust the tilting angle of the mirror, thereby keeping the laser beam aligned onto the droplet with very high accuracy (2-10 μm).

Rather than rely entirely on the signals from the illuminator sensors, additional sensors and feedback paths will generally be provided in the radiation system 42 itself, to provide for more rapid, direct and/or self-contained control of the radiation source. Such sensors may include one or more cameras, for example, monitoring the location of the plasma. By this combination of means, the location of beam 55 can be maintained in the aperture 52, and damage to the equipment is avoided, and efficient use of the radiation is maintained.

In addition to monitoring the position of the plasma, sensors at the illumination system and sensors at the reticle level monitor the intensity of the EUV radiation, and provide feedback to control module 20. Conventionally, intensity is controlled for example by adjusting the energy of the laser pulses.

Radiation passed by collector optic 50 passes in this example through a transmissive filter spectral purity filter SPF, located near the intermediate focus point 52.

An LPP EUV light source comprising an arrangement to irradiate a target material in order with a pre-pulse of laser light and a main pulse of laser light is described in United States Patent Application Publication US2011/0013166, which is incorporated by reference herein in its entirety. The pre-pulse of laser light serves to heat and expand the target material before it reaches a position where it is hit by the main pulse of laser light. In such an arrangement an improved Conversion Efficiency can be obtained. A heated and expanded droplet of target material is also referred to, hereinafter, as a droplet-cloud or cloud.

Figure 4:
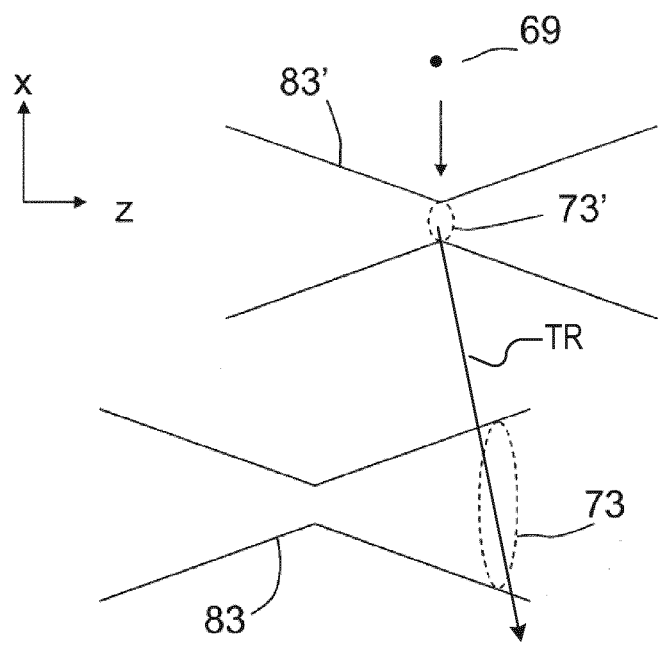
FIG. 4 is a schematic illustration of an arrangement where a droplet of fuel is excited by a pre-pulse laser and main laser.

FIG. 4 schematically illustrates an arrangement where a droplet of target material 69 reaches a predetermined preconditioning position 73' which is located upstream in the trajectory of the droplet with respect to a further, predetermined plasma formation position 73. In use, droplets of the target material 69, for example Sn or Xe, are moved along a trajectory, in FIG. 2 by dropping or firing the droplets from a position above the predetermined preconditioning position and the predetermined plasma forming position. When such a droplet reaches the predetermined preconditioning position 73', it is impacted by a pre pulse laser light beam 83'. The resultant pre-conditioned (expanded) droplet continues along path TR until it arrives at predetermined plasma formation position 73 where it is impacted by a main pulse beam 83.

The interaction at the predetermined preconditioning position 73' causes the droplet of the target material 69 to heat and expand before it reaches the predetermined plasma formation position 73. This may be advantageous to conversion efficiency when the EUV radiation is created from the droplet. The EUV radiation system with the preconditioned droplet or cloud is thus expected to provide more EUV radiation, thereby improving throughput of any lithographic apparatus in which it is employed.

As is known, a beam of laser radiation will have a finite cross-sectional area that tapers to a location known as the 'beam waist' and then widens again. This beam waist is illustrated just in advance of the plasma position 73, although it could equally be on the other side of the plasma position. The tapering is greatly exaggerated in these diagrams.

The two focal positions of the two beams should be arranged with respect to each other such that the pre pulse beam 83' hits the droplet in the best focus position of the laser's focusing lens, and the main pulse beam 83 hits the preconditioned expanded droplet (typically disk shaped) at a position (i.e., plasma formation position 73) in which the droplet has a predetermined diameter (for example 250 μm). To maximize EUV yield, the diameter of the main beam at this plasma formation position should be the slightly larger than the diameter of the preconditioned droplet. For example the diameter of the main pulse beam 83 may be 350 μm, or 40% larger than the droplet. More generally the beam may be anything up to 50% larger than the droplet, and possibly larger still. The reason for this "overfill" is that plasma produced from a 250 μm preconditioned droplet may be somewhat larger than (by about 40%) the size of the preconditioned droplet. This overfill further ensures that no droplet fragments escape from the heated disc outside of the laser beam diameter as this would increase formation of tin debris. In another embodiment, the diameter of the main beam at the plasma formation position is approximately the same than (or similar to) the diameter of the preconditioned droplet.

In order to position the foci of the main beam and pre pulse beam with respect to each other, the two beams are arranged to travel different paths, such that they can be manipulated independently. Lateral adjustments can be applied by moving one of the two beams (i.e., by tilting a mirror directing one of the beams). However, any axial movement is currently achieved by substituting an optical element in one of the two beam paths with another one that has a slightly different optical power. Because elements need to be exchanged, the set-up of such a system is a very cumbersome process which has only a discrete number of possible positions. If the heat load increases or decreases, the foci will shift with respect to each other. To compensate for this, the focusing element needs to be exchanged again, leading to an unworkable situation.

Figure 5:
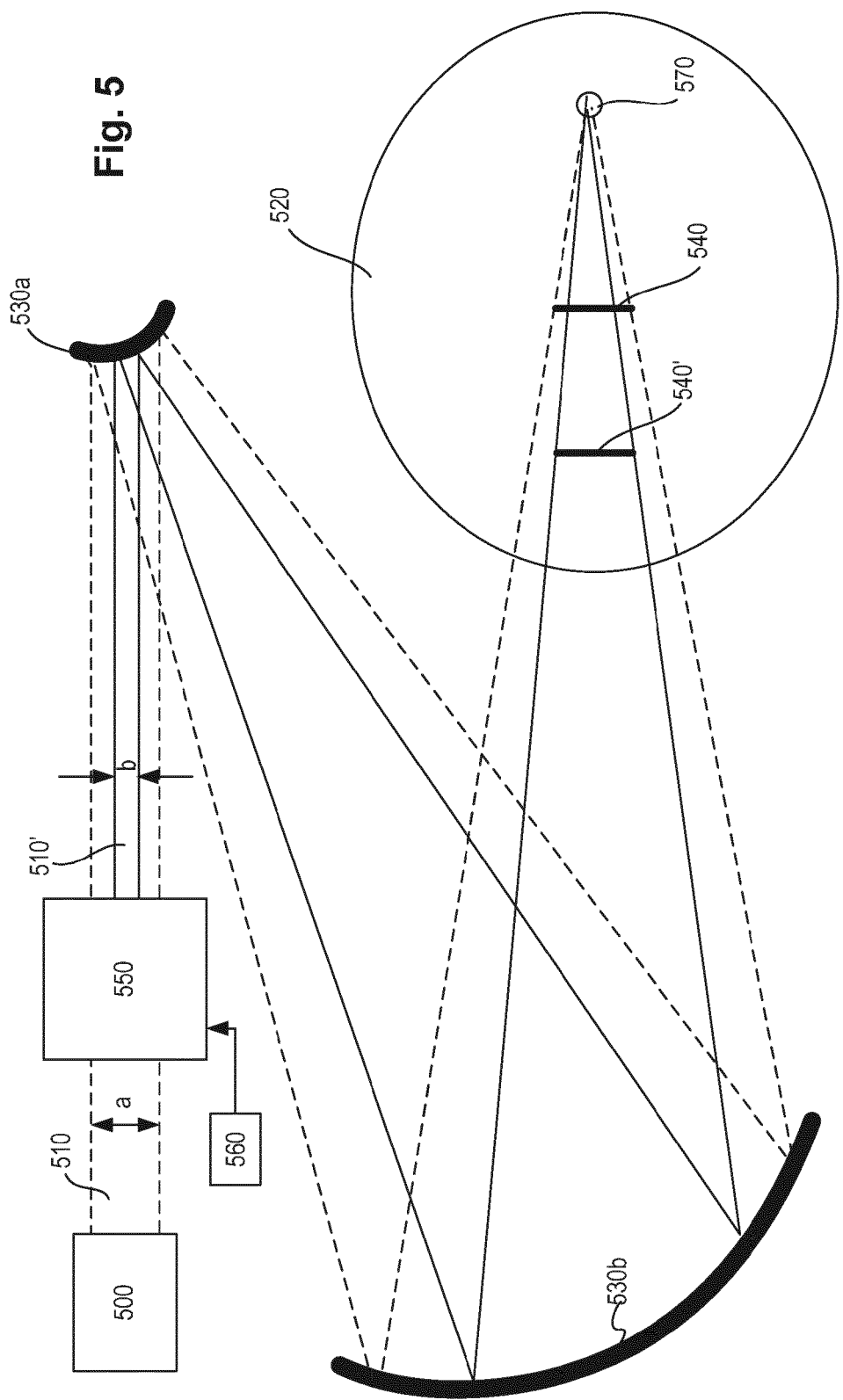
FIG. 5 schematically illustrates an apparatus according to an embodiment of the invention.

FIG. 5 shows a laser arrangement which addresses the above issue. It shows a laser 500, which may be a MOPA laser $CO_2$ laser as described herein emitting a beam 510 (shown using broken lines), having a diameter a. This beam 510 is shown being directed to a focal region 520 via mirrors 530a, 530b. The mirrors 530a, 530b may form part of a beam delivery system such as that already described. While only two mirrors are shown here for simplicity, typically a beam delivery system may comprise several more mirrors. Here, mirror 530a is a negative power mirror and mirror 530b is a positive power mirror. The plasma formation position 540 is the position where the preconditioned fuel droplet is of a desired size (predetermined diameter). At this point the beam diameter should be equal to or larger than (e.g., up to 50% larger) the diameter of the preconditioned fuel droplet. This position 540 is shown here preceding the beam waist, although plasma formation position 540 may equally be in advance of the beam waist.

To vary the axial position of where the beam has a particular diameter, variable zoom optics 550 are provided, for example a variable beam expander. FIG. 5 shows the zoom optics 550 being used to reduce the beam diameter, resulting in beam 510' (shown using solid lines) having beam diameter b. The result of this reduced beam diameter is that the cross-sectional area of the beam on focusing mirrors 530a, 530b is reduced, and there is an axial shift in the position 540' where the beam diameter is of a desired size with respect to the fuel droplet. In this way, it is possible to adjust the axial position at which the optimum beam diameter is realized. Alternatively, the same mechanism can be used to achieve an adjustable beam diameter at a desired axial location.

It can be seen that, in adjusting the axial position at which the optimum beam diameter is realized, the actual focus position 570 of the beam does not change. Both beam 510 and 510' are focused at focus position 570. Consequently the zoom optics 550 operate to adjust the position at which the beam has a specific diameter with respect to the beam's focus position 570. It is at this focus position 570 that the pre-pulse beam should hit the fuel droplet in order to precondition it, prior to the main beam hitting the preconditioned droplet at position 540 or position 540' (or elsewhere along this axis, within focal region 520 depending on the position at which the preconditioned droplet reaches a predetermined diameter).

A controller 560 may be provided to control the zoom optics so as to control the axial position of a desired beam diameter, or the beam diameter at a desired position. The controller 560 may be the same as any of those described in relation to FIGS. 1 and 2.

While the zoom optics may be transmissive, in a preferred embodiment reflective optics are used. Such an all-reflective zoom optical system may take many forms such as, for example, the arrangements described in U.S. Pat. No. 5,144,476, which is incorporated by reference herein in its entirety. Such an arrangement may comprise one or more moveable mirrors between a fixed focusing mirror and the optical system output. The specific arrangements described in U.S. Pat. No. 5,144,476 shows a system of three or four mirrors in total, and results in a shifted optical axis which should be returned to the original optical axis using, for example, one or more further mirrors. In a four mirror arrangement, the primary (fixed) mirror includes a central axis defining the system optical axis. The primary mirror is fixably or stationarily positioned with respect to the optical axis. The primary mirror may be a positive power mirror. The secondary mirror may be a negative power mirror and is movably positioned such that it is in a cassegrain configuration with the primary mirror. The vertex of the secondary mirror would be positioned along the optical axis of the system. The tertiary mirror may be a positive power mirror. The tertiary mirror is movably positioned such that its vertex would be positioned along the optical axis of the system. The quaternary mirror may be a positive power mirror. The quaternary mirror is movably positioned such that its vertex would be along the optical axis of the system. The combination of movement of the secondary tertiary and quaternary mirrors preserves the line of sight, focus collimation and exit pupil position during the zoom operation. All mirrors may be rotationally symmetric and centered along a common optical axis and the movable mirror's movement is along the optical axis.

In operation, an object to be viewed is reflected by the primary mirror. The light beams from the object being viewed are received and reflected from the primary mirror to the secondary mirror. The light beams are received by and reflected from the secondary mirror to the tertiary mirror. The beams form an intermediate image of the object being viewed between the secondary and tertiary mirrors. The intermediate image is reflected from the tertiary mirror to the quaternary mirror and through the remainder of the system and is ultimately reimaged at infinity after passing through the exit pupil.

Although specific reference may be made in this text to the provision and operation of an EUV radiation source in a lithographic apparatus, it should be understood that the EUV radiation apparatus described herein may have other applications in EUV optical apparatus. Further in the case of a lithographic apparatus, this may have other applications besides the manufacture of ICs, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The present invention may further be described by the following clauses:

1. A beam delivery apparatus for a laser produced plasma source comprising:
   variable zoom optics configured to condition a beam of radiation so as to output a conditioned beam having a configurable beam diameter; and a plurality of mirrors configured to direct the conditioned beam of radiation to a plasma generation site.
2. The beam delivery apparatus of clause 1, wherein the plurality of mirrors comprises at least a first negative mirror and second positive mirror, the first negative mirror preceding the second positive mirror in the beam delivery system.
3. The beam delivery apparatus of clause 1, wherein the variable zoom optics comprises a variable beam expander.
4. The beam delivery apparatus of clause 1, wherein the variable zoom optics comprises only reflective optical elements.
5. The beam delivery apparatus of clause 4, wherein the variable zoom optics comprises one fixed mirror and a plurality of moveable mirrors.
6. The beam delivery apparatus of clause 1, further comprising a controller for controlling the variable zoom optics.
7. The beam delivery apparatus of clause 6, wherein, at the plasma generation site, the beam of radiation has a non-uniform diameter along its optical axis and the controller is operable to control the axial position at which the beam has a particular diameter, with respect to the beam's focus position.
8. The beam delivery apparatus of clause 7, wherein the controller is operable to configure the beam diameter of the conditioned beam such that the beam has a desired diameter at a desired axial position at the plasma generation site.
9. The beam delivery apparatus of clause 7, wherein the controller is operable to configure the beam diameter of the conditioned beam so as to control the diameter of a beam delivered by the beam delivery apparatus at a particular axial position at the plasma generation site.
10. An EUV radiation system comprising:
laser apparatus operable to emit a main beam of radiation;
a plasma generation site located at a position in which a fuel will be contacted by the beam of radiation to form a plasma; and
a beam delivery apparatus, comprising:
variable zoom optics configured to condition a beam of radiation so as to output a conditioned beam having a configurable beam diameter; and
a plurality of mirrors configured to direct the conditioned beam of radiation to a plasma generation site
wherein the beam delivery apparatus is configured to direct the beam of radiation from the laser device to the plasma generation site.
11. The EUV radiation system of clause 10, wherein the laser apparatus is operable to emit a preconditioning beam to precondition the fuel prior to emission of the main beam.
12. The EUV radiation system of clause 11 configured to:
precondition a fuel droplet to form a preconditioned fuel droplet having a diameter d; determine a position at which the preconditioned fuel droplet has a desired form; and
configure the beam diameter of the conditioned beam such that the conditioned beam has a diameter equal to or greater than diameter d at the determined position at which the preconditioned fuel droplet has a desired form.
13. The EUV radiation system of clause 12, wherein the conditioned beam has a diameter between diameter d and 1.5 times diameter d at the determined position at which the preconditioned fuel droplet has a desired form.
14. The EUV radiation system of clause 11, wherein the preconditioning beam hits the fuel droplet at the focus position of the conditioned beam.
15. A lithographic apparatus, comprising an EUV radiation system of any of clauses 10 to 14 configured to generate a beam of EUV radiation;
16. A lithographic apparatus of clause 15, further comprising an illumination system configured to condition the beam of radiation;
a support constructed to support a patterning device, the patterning device being capable of imparting the beam of radiation with a pattern in its cross-section to form a patterned beam of radiation;
a substrate table constructed to hold a substrate; and
a projection system configured to project the patterned beam of radiation onto a target portion of the substrate.
17. A method of controlling the axial position of the location at a plasma generation site where a beam has a particular diameter, with respect to the beam's focus position, the beam of radiation having a non-uniform diameter along its optical axis, the method comprising:
passing the beam through variable zoom optics to obtain a conditioned beam;
directing the conditioned beam to the plasma generation site; and
using the variable zoom optics to control of the axial position at which the beam has a particular diameter, with respect to the beam's focus position.
18. The method of clause 17, comprising:
preconditioning a fuel droplet to form a preconditioned fuel droplet having a diameter d;
determining a position at which the preconditioned fuel droplet has a desired form; and
varying the beam diameter of the conditioned beam such that the directed beam at the plasma generation site has a diameter equal to or greater than diameter d at the determined position at which the preconditioned fuel droplet has a desired form.
19. The method of clause 18, wherein the conditioned beam has a diameter between diameter d and 1.5 times diameter d at the determined position at which the preconditioned fuel droplet has a desired form.
20. The method of clause 17, wherein the directing the conditioned beam comprises using at least a first negative mirror followed by a second positive mirror to direct the conditioned beam.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A beam delivery apparatus for a laser produced plasma source comprising:
    variable zoom optics configured to condition a beam of radiation so as to output a conditioned beam having a configurable beam diameter;
    a plurality of mirrors configured to direct the conditioned beam to a plasma generation site; and
    a controller configured to control the variable zoom optics based on a size of a fuel droplet at the plasma generation site, wherein an axial position of the plasma generation site is different from a focus position of the conditioned beam.

2. The beam delivery apparatus of claim 1, wherein the plurality of mirrors comprises at least a first negative mirror and second positive mirror, the first negative mirror preceding the second positive mirror in the beam delivery apparatus.

3. The beam delivery apparatus of claim 1, wherein the variable zoom optics comprises a variable beam expander.

4. The beam delivery apparatus of claim 1, wherein the variable zoom optics comprises only reflective optical elements.

5. The beam delivery apparatus of claim 4, wherein the variable zoom optics comprises one fixed mirror and a plurality of moveable mirrors.

6. The beam delivery apparatus of claim 1, wherein the conditioned beam has a variable diameter along its optical axis and the controller is configured to control the variable zoom optics such that the conditioned beam has a particular diameter at the plasma generation site, with respect to the focus position of the conditioned beam.

7. The beam delivery apparatus of claim 1, wherein the controller is configured to control the variable zoom optics such that the conditioned beam has a desired diameter at the plasma generation site.

8. The beam delivery apparatus of claim 1, wherein the controller is configured to control the variable zoom optics to control a diameter of the conditioned beam at the plasma generation site.

9. An EUV radiation system comprising:
    a laser apparatus configured to emit a main beam of radiation;
    a plasma generation site located at a position in which a fuel comes into contact with the main beam of radiation to form a plasma; and
    a beam delivery apparatus configured to direct the main beam of radiation from the laser apparatus to the plasma generation site, the beam delivery apparatus comprising:
        variable zoom optics configured to condition the main beam of radiation so as to output a conditioned beam having a configurable beam diameter;
        a plurality of mirrors configured to direct the conditioned beam to the plasma generation site; and
        a controller configured to control the variable zoom optics based on a size of a fuel droplet at the plasma generation site, wherein an axial position of the plasma generation site is different from a focus position of the conditioned beam.

10. The EUV radiation system of claim 9, wherein the laser apparatus is further configured to emit a preconditioning beam to precondition the fuel prior to emission of the main beam of radiation.

11. The EUV radiation system of claim 9, further to:
    precondition the fuel to form a preconditioned fuel droplet;
    determine a position of the preconditioned fuel droplet at which the preconditioned fuel droplet has a desired form and a diameter d; and
    adjust the variable zoom optics such that the conditioned beam has a diameter equal to or greater than the diameter d at the determined position of the preconditioned fuel droplet.

12. The EUV radiation system of claim 11, wherein the diameter of the conditioned beam at the determined position of the preconditioned fuel droplet is between diameter d and 1.5 times the diameter d.

13. The EUV radiation system of claim 11, wherein the preconditioning beam hits the fuel at a focus position of the preconditioning beam.

14. A lithographic apparatus, comprising:
    a laser apparatus operably configured to emit a main beam of radiation;
    a plasma generation site located at a position in which a fuel will be contacted by the main beam of radiation to form a plasma; and
    a beam delivery apparatus configured to direct the main beam of radiation from the laser apparatus to the plasma generation site, the beam delivery apparatus comprising:
        variable zoom optics configured to condition the main beam of radiation so as to output a conditioned beam having a configurable beam diameter, the configurable beam diameter;
        a plurality of mirrors configured to direct the conditioned beam to the plasma generation site to form a beam of EUV radiation; and
        a controller configured to control the variable zoom optics based on a size of a fuel droplet at the plasma generation site, wherein an axial position of the plasma generation site is different from a focus position of the conditioned beam.

15. The lithographic apparatus of claim 14, further comprising:
    an illumination system configured to condition the main beam of radiation;
    a support constructed to support a patterning device, the patterning device configured to impart the beam of EUV radiation with a pattern in its cross-section to form a patterned beam of radiation;
    a substrate table constructed to hold a substrate; and a projection system configured to project the patterned beam of radiation onto a target portion of the substrate.

16. A method, comprising:

passing a beam of radiation through variable zoom optics to obtain a conditioned beam having a configurable beam diameter;

directing the condition beam a plasma generation site; and controlling the variable zoom optics based on a size of a fuel droplet at the plasma generation site, wherein an axial position of the plasma generation site is different from a focus position of the conditioned beam.

17. The method of claim 16, further comprising:

preconditioning the fuel droplet to form a preconditioned fuel droplet;

determining a position of the preconditioned fuel droplet at which the preconditioned fuel droplet has a desired form and a diameter d; and varying the variable zoom optics such that the conditioned beam at the plasma generation site has a diameter equal to or greater than the diameter d.

18. The method of claim 17, wherein the diameter of the conditioned beam is between the diameter d and 1.5 times the diameter d at the determined position at which the preconditioned fuel droplet has the desired form.

19. The method of claim 16, wherein the directing the conditioned beam comprises directing the conditioned beam via at least a first negative mirror followed by a second positive mirror.

* * * * *

UNITED STATES PATENT AND TRADEMARK OFFICE
CERTIFICATE OF CORRECTION

PATENT NO. : 10,289,006 B2
APPLICATION NO. : 14/648452
DATED : May 14, 2019
INVENTOR(S) : Van Schoot et al.

Page 1 of 1

It is certified that error appears in the above-identified patent and that said Letters Patent is hereby corrected as shown below:

In the Claims

In Column 16, Lines 49-50, in Claim 14, please replace "a configurable beam diameter, the configurable beam diameter;" with --a configurable beam diameter;--.

In Column 17, Line 22, in Claim 18, please replace "1.5times" with --1.5 times--.

Signed and Sealed this
Tenth Day of September, 2019

Andrei Iancu
*Director of the United States Patent and Trademark Office*